(12) United States Patent
Navarro Paredes et al.

(10) Patent No.: US 10,859,925 B2
(45) Date of Patent: Dec. 8, 2020

(54) METHOD OF AND SYSTEM FOR DETERMINING AN OVERLAY OR ALIGNMENT ERROR BETWEEN A FIRST AND A SECOND DEVICE LAYER OF A MULTILAYER SEMICONDUCTOR DEVICE

(71) Applicant: Nederlandse Organisatie voor toegepast-natuurwetenschappelijk onderzoek TNO, s-Gravenhage (NL)

(72) Inventors: Violeta Navarro Paredes, Eindhoven (NL); Maarten Hubertus van Es, Voorschoten (NL); Hamed Sadeghian Marnani, Nootdorp (NL)

(73) Assignee: Nederlandse Organisatie voor toegepast-natuurwetenschappelijk Onderzoek TNO, 's-Gravenhage (NL)

( * ) Notice: Subject to any disclaimer, the term of this patent is extended or adjusted under 35 U.S.C. 154(b) by 0 days.

(21) Appl. No.: 16/477,347

(22) PCT Filed: Jan. 11, 2018

(86) PCT No.: PCT/NL2018/050019
§ 371 (c)(1),
(2) Date: Jul. 11, 2019

(87) PCT Pub. No.: WO2018/132004
PCT Pub. Date: Jul. 19, 2018

(65) Prior Publication Data
US 2019/0378769 A1    Dec. 12, 2019

(30) Foreign Application Priority Data

Jan. 13, 2017  (EP) .................................... 17151427

(51) Int. Cl.
*G03F 7/20*  (2006.01)
*H01L 21/68*  (2006.01)
(Continued)

(52) U.S. Cl.
CPC .......... *G03F 7/70633* (2013.01); *H01L 21/68* (2013.01); *H01L 22/12* (2013.01); *G01Q 60/38* (2013.01)

(58) Field of Classification Search
None
See application file for complete search history.

(56) References Cited

U.S. PATENT DOCUMENTS

| 5,503,010 A | 4/1996 | Yamanaka |
| 5,831,739 A | 11/1998 | Ota |

(Continued)

OTHER PUBLICATIONS

M. Teresa Cuberes et al., "Mechanical-Diode Mode Ultrasonic Friction Force Microscopy," Journal of Physics: Conference Series vol. 61, No. 1, pp. 224-228, XP020124444 (Mar. 2007).

(Continued)

*Primary Examiner* — Michelle M Iacoletti
(74) *Attorney, Agent, or Firm* — Leydig, Voit & Mayer, Ltd.

(57) ABSTRACT

The present document relates to a method of determining an overlay or alignment error between a first and a second device layer of a multilayer semiconductor device (26) using an atomic force microscopy system (20). The system comprises a scan head (22) including a probe (28). The probe includes a cantilever and a probe tip (30). The method comprises moving the probe tip and the semiconductor device relative to each other for scanning of the surface of the semiconductor device with the probe tip, wherein the probe tip is intermittently or continuously in contact with the surface during scanning. During scanning a signal application actuator (70) applies an acoustic input signal to the substrate, and motion of the probe tip is monitored with a tip position detector for obtaining an output signal, to be analyzed for mapping subsurface structures in different device layers. The signal application actuator includes a (Continued)

shear wave actuator to apply a shear acoustic wave (90) in the substrate. The output signal (39) is indicative of torsional deflection of the probe tip. The document further describes a system.

18 Claims, 4 Drawing Sheets

(51) Int. Cl.
*H01L 21/66* (2006.01)
*G01Q 60/38* (2010.01)

(56) References Cited

U.S. PATENT DOCUMENTS

| | | | |
|---|---|---|---|
| 6,704,089 B2 | 3/2004 | van der Schaar et al. |
| 7,397,596 B2 | 7/2008 | Yacoubian |
| 8,302,480 B2 | 11/2012 | Maris et al. |
| 2007/0107502 A1 | 5/2007 | Degertekin |
| 2008/0276695 A1 | 11/2008 | Prater et al. |

OTHER PUBLICATIONS

M.H. Kahrobaiyan et al., "Sensitivity and Resonant Frequency of an AFM with Sidewall and Top-Surface Probes for Both Flexural and Torsional Modes," International Journal of Mechanical Sciences, Pergamon Press, vol. 52, No. 10, pp. 1357-1365, XP027197503 (Oct. 2010).

European Patent Office, International Search Report in corresponding International Application No. PCT/NL2018/050019, dated Apr. 9, 2018 (3 pages).

Hua et al., "Studies on Stacking Faults & Crystalline Defects in Fabrication Silicon Wafer Substrate," ICSE'98 Proc., Nov. 1998, Bangi, Malaysia (8 pages).

Hu et al., "Imaging of Subsurface Structures Using Atomic Force Acoustic Microscopy at GHz Frequencies," Journal of Applied Physics 109, 084324, pp. 084324-1-084324-6 (2011).

Kwak et al., "Visualization of Interior Structures with Nanoscale Resolution Using Ultrasonic-Atomic Force Microscopy," Proc. of SPIE, vol. 8691, pp. 889117-1-869117-9 (2013).

Kawagishi et al., "Mapping of Lateral Vibration of the Tip in Atomic Force Microscopy at the Torsional Resonance of the Cantilever," Ultramicroscopy 91, pp. 37-48 (2002).

METHOD OF AND SYSTEM FOR DETERMINING AN OVERLAY OR ALIGNMENT ERROR BETWEEN A FIRST AND A SECOND DEVICE LAYER OF A MULTILAYER SEMICONDUCTOR DEVICE

CROSS-REFERENCE TO RELATED APPLICATIONS

This patent application is a U.S. National Phase of PCT International Application No. PCT/NL2018/050019, filed Jan. 11, 2018, which claims priority to European Application No, 17151427.6, filed Jan. 13, 2017, which are both expressly incorporated by reference in their entireties, including any references contained therein.

FIELD OF THE INVENTION

The present invention is directed at a method of determining an overlay or alignment error between a first and a second device layer of a multilayer semiconductor device using an atomic force microscopy system, wherein the atomic force microscopy system comprises at least one scan head, the scan head including a probe, the probe comprising a cantilever and a probe tip arranged on the cantilever. The invention is further directed at a system for performing such a method.

BACKGROUND

Developments in the semiconductor industry are typically governed by Moore's law which predicts that the number of transistors in a dense integrated circuit doubles every two years. As will be appreciated, this poses significant technological challenges whenever technological boundaries constituted by physical laws are encountered and need to be overcome to meet the industry demands for even smaller and smaller integrated circuits.

One typical challenge encountered already in the twentieth century, was the need to take into account interlayer misalignment between functional layers of a multilayer semiconductor device. In the multilayered structure of semiconductor devices, functional device layers are typically deposited on top of other functional device layers. The functional product features, i.e. the features of the pattern formed in each layer, need to be aligned accurately with those in contiguous functional layers to enable correct operation of the end product: the semiconductor device. This is achieved by monitoring an overlay error during manufacturing, i.e. the amount of misalignment between subsequent layers, by determining relative positions between marker elements in subsequent layers. This improvement, and the advancements achieved after this in the determination of overlay errors, has allowed to continue making semiconductor elements smaller and smaller over the past decades, in accordance with Moore's law.

The current state of the technology that is applied for measuring overlay error, is the use of diffraction optics to determine a relative distance between marker elements. A disadvantage of these methods is that they cannot be applied to methods such as extreme ultraviolet (EUV) lithography, as EUV resists are based on metals which are opaque to light in that wavelength range.

Another disadvantage of the current determination methods for determining overlay error, is that the marker features that can be 'seen' using the diffraction optical methods applied are of much larger dimensions than the functional product features, i.e. pattern features, that are nowadays desired in accordance with Moore's law. Therefore, even though the correct alignment of marker elements in subsequent layers of a multilayer semiconductor device can be established by monitoring the overlay error with existing techniques, it can still not be guaranteed that also the smaller pattern features in subsequent layers are correctly aligned. These small pattern features are affected differently by sensing errors, e.g. lens errors, of the alignment sensor used for determining the overlay error. Hence, an undesired or destructive overlay error is more and more difficult to rule out during manufacturing.

SUMMARY OF THE INVENTION

It is an object of the present invention to provide a method of determining an overlay error that can be applied during manufacturing of a multilayer semiconductor device, and which overcomes the disadvantages described above, allowing the correct determination of overlay errors for even the smallest pattern features desired to be manufactured.

To this end, in accordance with a first aspect, there is provided herewith a method of determining an overlay or alignment error between a first and a second device layer of a multilayer semiconductor device using an atomic force microscopy system, wherein the atomic force microscopy system comprises at least one scan head, the scan head including a probe, the probe comprising a cantilever and a probe tip arranged on the cantilever, wherein the method comprises: moving the probe tip and the semiconductor device relative to each other in one or more directions parallel to the surface of the semiconductor device for scanning of the surface with the probe tip, the probe tip being at least intermittently or continuously in contact with the substrate surface during said scanning; applying, during said scanning, using a signal application actuator, an acoustic input signal to the substrate; monitoring motion of the probe tip relative to the scan head with a tip position detector during said scanning for obtaining an output signal; and analyzing the output signal for mapping one or more subsurface structures below the surface of the semiconductor device, the subsurface structures being located in at least one of the first or second device layer, and determining the overlay or alignment error between the first device layer and the second device layer based on the analysis; wherein the signal application actuator includes a shear wave actuator, and the step of applying an acoustic input signal comprises applying the acoustic input signal to the substrate using at least the shear wave actuator such as to provide a shear acoustic wave in the substrate; and wherein the output signal at least includes a sensor signal component indicative of torsional deflection of the probe tip, the method including obtaining said sensor signal component indicative of torsional deflection of the probe tip.

In the method of the present invention, imaging of subsurface structures such as to map these structures in several device layers to monitor their alignment or overlay, is achieved by torsional mode subsurface atomic force microscopy (AFM). The torsional oscillation of the cantilever has enhanced sensitivity to shear rigidity, which makes it specially useful for visualizing the alignment and overlay of in-plane features in layers below the surface with other features at the surface. Advantageously, this method provides the very high lateral resolution obtainable using AFM. For example, using high resolution probes, a lateral resolution below 1 nanometer (nm) is attainable. Moreover, the method of the present invention may be performed on a wide range of materials with respect to the structures and intermediate layers to be visualized. For example, the method may be applied to penetrate metal layers, allowing visualization of structures below e.g. EUV type resists or electrode layers. In addition, torsional mode AFM provides an enhanced sensitivity to detecting in-plane defects (i.e. parallel to the surface), such as cracks, lattice structure defects or misalignments. Conventional subsurface imaging methods do not allow to detect such in-plane defects.

As an additional effect, due to the detectability of alignment and overlay errors on sub-nanometer scale, application of the present invention enables to further reduce the size of alignment features and other device features. This is due to the fact that the method provides a means to monitor the manufacturing process, and thereby to manage it where necessary. In turn, this adds to the performance of semiconductor devices.

In relation to alternative ultrasonic AFM based subsurface imaging methods, it is to be noted that the present method may be applied at much lower set-point forces. As a result, the method of the present invention may be applied to device layers that are prone to damage at higher set-points, and thus can be applied in more situations. In particular, in those applications wherein regular ultrasonic AFM methods do not provide sufficient contrast stiffness, e.g. in a wafer stack, the regular ultrasonic AFM methods fail because these would require the set-point force to become too large. The method of the present invention, which may be provided at a lower set-point force (note that the set-point force may be as low as 100 nanonewton (nN)), in these situations may be applied to visualize the subsurface layers to perform overlay and alignment monitoring. In particular the method of the present invention benefits from low set-point forces, because the set-point force must be small enough not to quench the torsional vibration of the cantilever.

In accordance with some embodiments, the acoustic input signal applied to the substrate comprises an input signal component having a frequency within a range of 20% from at least one mode of torsional resonance of the cantilever. A better signal-to-noise ratio will be obtained by including a signal component in this range by exciting the respective torsional resonance mode or modes of the cantilever. In particular, in accordance with some embodiment, the acoustic input signal applied to the substrate comprises an input signal component having a frequency within a range of 100 kilohertz to 50 megahertz, preferably within a range of 100 kilohertz to 10 megahertz. At these frequencies, the tip-sample interaction in the lateral direction (torsional mode) is governed by the local shear visco-elastic properties.

In accordance with some further embodiments, the signal application actuator in addition to the shear wave actuator comprises a further actuator cooperating with the cantilever or the probe tip, the method comprising a step of applying a flexural vibration signal to the cantilever or the probe tip using the further actuator. As well as the shear acoustic wave excitation of the sample, applying an additional flexural excitation to the cantilever, can also increase the information from the marker. It can even be possible to decouple at several frequencies to obtain more information, for example at the (or close to) the first (or second) contact torsional resonant frequency of the cantilever and also at the frequency of flexural excitation of the cantilever simultaneously. For example, in some embodiments, the flexural vibration signal comprises at least one flexural signal component having a frequency in a range between 10 kilohertz to 200 megahertz. The acoustic input signal may comprise signal components for example within a range of 20% from a mode of torsional resonance of the cantilever, and/or within a range of 20% from a mode of flexural resonance of the cantilever.

Yet in some other embodiments, the acoustic input signal applied to the substrate for providing the shear acoustic wave in the substrate comprises an input signal component having a frequency within a range of 50 megahertz to 500 gigahertz. In this range, the shear waves propagate through the sample with only little attenuation, and will be scattered by any subsurface structures.

The downside of these high frequencies is that additional measures may be required to allow the probe to detect the scattered waves or to couple any information from the very high frequency waves into the probe. One manner to achieve this may be to apply a heterodyne detection method, in accordance with some embodiments. This may be achieved, for example by embodiments wherein the acoustic input signal comprises a third input signal component at a third frequency and a fourth input signal component at a fourth frequency, which third and fourth input signal components together provide a mixed acoustic signal, wherein the mixed acoustic signal comprises a fifth signal component having a frequency equal to a difference between the third frequency and the fourth frequency, wherein the frequency of the fifth signal component is below 1 gigahertz.

In accordance with a second aspect, there is provided a system atomic force microscopy system for determining an overlay or alignment error between a first and a second device layer in a substrate comprising a multilayer semiconductor device, wherein the system comprises a substrate carrier for supporting the substrate, and at least one scan head including a probe, the probe comprising a cantilever and a probe tip arranged on the cantilever, wherein the system further comprises an actuator for moving the substrate carrier or the scan head, such as to move the probe tip and the semiconductor device relative to each other in one or more directions parallel to a surface of the substrate for scanning of the surface with the probe tip, and such that the probe tip is at least intermittently or continuously in contact with the substrate surface during said scanning; further comprising: a signal application actuator for applying, during said scanning, an acoustic input signal to the substrate; a tip position detector for monitoring motion of the probe tip relative to the scan head during said scanning for obtaining an output signal; and an signal analyzer configured for analyzing the output signal from the tip position detector, for mapping one or more subsurface structures located in at least one of the first or second device layer, and configured for determining the overlay or alignment error between the first device layer and the second device layer; wherein the signal application actuator includes a shear wave actuator for applying a shear acoustic wave in the substrate; and wherein analyzer is configured for obtaining from the output signal a signal component indicative of a torsional deflection of the probe tip.

The shear wave actuator may comprise a piezo type shear wave transducer enabling application of shear waves of up to a few gigahertz. Much higher frequencies are achievable using shear wave actuators based on photo-thermal acoustic stimulation of the sample. Here, a pulsed laser provides a pulsed laser beam or laser pulses that are impinged on an absorption layer of a carefully selected absorption material. The absorption material may be selected to well absorb optical radiation of a certain wavelength matching with the wavelength of the pulsed laser beam. The absorption layer may be arranged on the side faces of the sample, transverse to the surface. The thickness of the layer determines its resonance frequencies, thus the frequencies at which the layer starts vibrating under influence of photo-thermal expansion and relaxation. In particular, thermal expansion and relaxation of the absorption layer causes the layers to resonate at a frequency equal to:

generated frequency=sample speed of sound/sample optical thickness

To generate multiple very high frequencies, the absorption layer may comprise different portions of different thickness. Alternatively, or additionally, multiple absorption layers of different thicknesses may be present on the sample side, each generating its respective frequency.

To detect the torsional vibration component, use can be made of a four quadrant photo sensor. A laser beam (detection beam) may impinge on the cantilever and specular reflect therefrom falling onto the four quadrant photo sensor. The sensor consists of four quadrants designated A, B, C and D. Since the degree of torsion of the cantilever supporting the probe is a relative measure of surface friction caused by the lateral force exerted on the scanning probe, the laser spot intensity for quadrants (A+C)−(B+D) may be regarded as the frictional signal between the probe and the sample surface.

BRIEF DESCRIPTION OF THE DRAWINGS

The invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

DETAILED DESCRIPTION

Figure 1:
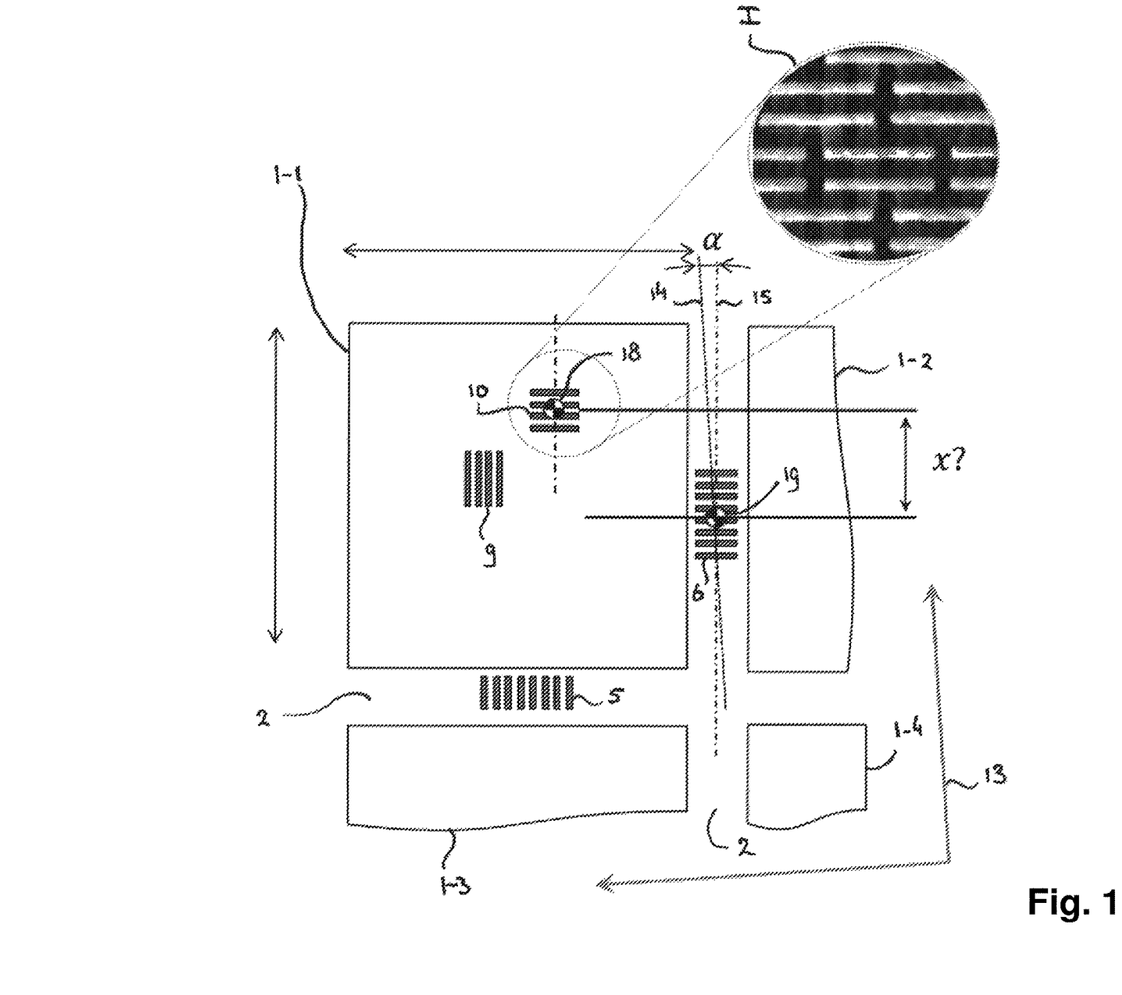
FIG. 1 schematically illustrates a situation sketch of a semi-conductor device during manufacturing in accordance with the present invention.

FIG. 1 schematically illustrates a situation sketch of a semi-conductor device 1-1 on a wafer during manufacturing in accordance with the present invention. In FIG. 1, semi-conductor device 1-1 is arranged on a wafer contiguous to a plurality of further semi-conductor devices 1-2, 1-3, 1-4. The wafer on which the devices 1-1, 1-2, 1-3 and 1-4 are arranged (not visible on the scale of focus of the situation sketch) may be placed on a metrology frame of a system for determining an overlay error in accordance with a present invention. The metrology frame at the wafer may not be neatly aligned, such that the scribing lanes 2 that separate the respective semi-conductor devices 1-1 to 1-4 (to be used for separating the semi-conductor devices) may be not be perfectly aligned with the metrology coordinate system 13 of the metrology frame. In FIG. 1, this is illustrated by the angle α between the alignment axes 15 of the scribing lane 2 and the alignment orientation 14 of the coordinate system 13 of the metrology frame.

In principle, semi-conductor devices of any arbitrary size may be produced in this manner. The size of the features that may be visualized using a method of the present invention is determined by the lateral resolution obtainable with AFM, and may be smaller than 1 nanometer (i.e. sub-nanometer size features). The method of the invention therefore can be applied with manufacturing methods that provide semiconductor elements such as multigate devices, e.g. finFETs and gate-all-around structures. Using the very high frequency excitation modes, i.e. shear wave signals of tens of gigahertz such as the heterodyne methods described above, the scattering of the signals and the low degree of attenuation allows for overlay and alignment monitoring of relatively thick multilayer semiconductor structures, such as 3D NAND elements. Naturally, the method may also be applied in combination with larger or more coarse semiconductor structures.

In the scribing lanes 2, in between two or more of the semi-conductor devices 1-1 through 1-4 to be created, one or more marker elements 5, 6 are present that allow to detect an overlay error between the subsequent layers of the multilayer semi-conductor devices 1-1 through 1-4. In FIG. 1, as can be seen the marker element 5 is present in the horizontal scribing lane 2 and a marker element 6 is present in the vertical scribing lane 2. The number and orientation of the marker elements, and the scribing lanes or other parts of the wafer wherein these may be located will be at the choice of the skilled person.

In addition, each of the semi-conductor devices 1-1 through 1-4 comprises two or more functional layers which comprise functional product features, also called pattern features 9, 10. In FIG. 1, schematically two pattern features 9 and 10 are illustrated but in reality the complex pattern of product features may be present in each functional product layer.

Conventionally, overlay error is determined by determining the relative positions of the marker elements 5 or 6 in subsequent layers, such as to establish the offset between these marker elements. Based on this offset, the system optics and other system parameters of the layer deposition system are calibrated such as to minimize or completely remove the offset. However, with the integrated circuits to be manufactured nowadays and in the future the pattern features 9, 10 and the line patterns of the marker elements, are of a much smaller size as discussed above (even sub-nanometer scale). In the situation sketch of FIG. 1 for example, in the enlargement I, there's provided a scanning electron microscopy (SEM) image of the pattern feature 10. The pattern feature 10 consists of a dense line spacing of unidirectional lines in one layer, and the SEM image shows an area of 500÷500 nanometer squared, illustrating that the line pitch is 22 nanometres. Typically, in the situation of FIG. 1 the marker elements 5 and 6 consist of one directional lines having a line pitch of 2.5 micrometres over a total marker area of 80×50 micrometres squared. Thus in the situation sketched in FIG. 1, the pattern features are approximately one-hundred times smaller then the features of the marker elements. Using a conventional method of determining the overlay error, which is for example based on deflection optics, the overlay error measured may not be accurate on the size scale of the pattern features of the patterns 9 and 10. This is for example caused by lens errors and/or other disturbance factors caused in the optical sensing technique, affecting features differently on the size scale of the pattern features 9 and 10. Therefore, by applying the conventional method of measuring the overlay error, critical mistakes that may cause the semi-conductor elements to be defective or not working can not be prevented.

The present invention allows not only the determination of the overlay error between the marker elements in an conventional manner, but to additionally determine the relative positions within each layer, of the marker elements and one or more or all of the product features 9, 10. The lateral resolution of the imaging method is high enough to visualize the exact layout of each layer including all features, and the method enables doing this for multiple layers. During manufacturing, this for example allows visualization of the layer underneath a photoresist such as to accurately verify or control the positioning of a mask or illumination pattern prior to patterning the resist.

Figure 2:
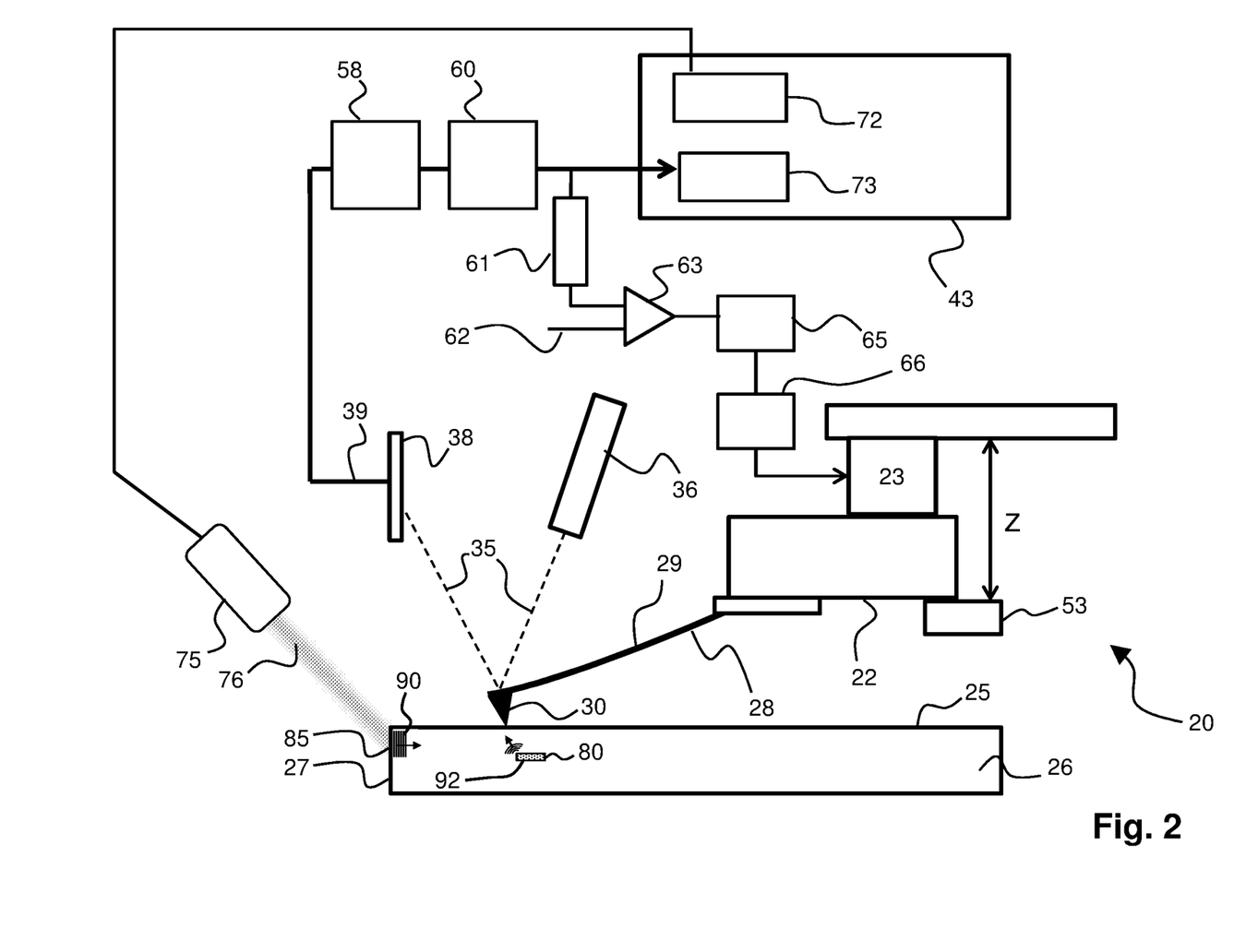
FIG. 2 illustrates a system in accordance with the present invention.

FIG. 2 schematically illustrates a measurement system 20 in accordance with an embodiment of the invention, which may be applied for performing a method in accordance with the present invention. In the system 20, a probe 28 is attached to a scan head 22. The scan head 22 enables scanning of the probe 28 relative to the surface 25 of a sample 26. The probe 28 consists of a cantilever 29 and a probe tip 30. During scanning, the probe tip 30 is brought in contact with the surface 25 of the sample 26. For example the probe tip 30 may be scanned across the surface 25 of the sample 26 in contact mode (continuous contact between the probe tip 30 and the surface 25 of the sample 26). A laser unit 36 provides a laser beam 35 that impinges on the cantilever 29 and reflects towards an optical detector 38 (e.g. photo diode). Using the optical detector 38, vibrations in the cantilever 29 can be sensed due to small deflections of the reflected beam 35 under the influence of such vibrations. This provides an output signal 39 for further analysis. The photo diode 38, in accordance with some embodiments and as further explained in relation to FIG. 4, may be a four quadrant photo diode. As may be appreciated, although in FIG. 1 a single scan head 22 is depicted, the method may equally be applied in systems including multiple scan heads.

The present system enables to apply a very high frequency acoustic input signal 90 as a shear wave signal to the sample 26. In system 20, a controller 72 controls operation of a pulsed laser 75. The pulsed laser 75 generates an optical signal laser beam 76 having a duration in accordance with that of the control signal received from generator 72. It may be preferred to apply the pulsed laser beam 76 for only a limited duration, to prevent heat development in the sample 26. An absorption layer 85 is present on the side face 27 of the sample 26. The absorption layer 85 is made of a material having an optical absorption coefficient that corresponds with the wavelength of the optical radiation of pulsed laser beam 76. Thus, the absorption layer 85 and the wavelength of laser 75 are chosen to match this requirement. The laser beam 76 is made to impinge on absorption layer 85, as illustrated in FIG. 1. The absorption layer 85 has a carefully selected thickness, which is selected dependent on the sound velocity of the material of which absorption layer 85 is made. Because laser beam 76 is a pulsed laser beam, thermal expansion and relaxation of the absorption layer causes the layer to resonate at a frequency equal to:

generated frequency=sample speed of sound/sample optical thickness

Thus, impinging the laser beam 76 on the side face 27 of the sample 26, causes the absorption layer 85 to start vibrating at the above generated frequency. The velocity of sound in the absorption layer 85 is largely dependent on the material, and likewise, so will the preferred thickness of the layer 85 be dependent on this sound velocity in relation to the desired frequency of the acoustic input signal. To provide at least one example, if the velocity of sound of the material is 10000 meters per second (m/s) and the desired frequency is 1 gigahertz (1 GHz=109 hertz (Hz)), then the thickness of the layer 85 would have to be 10 nanometer. The velocity of sound, however, may for different materials easily be anywhere between 2000 m/s and 20000 m/s. Suitable materials for forming the absorption layer may include any one or more of the following materials: aluminum, chromium, tantalum, tungsten.

The shear wave signal 90 may be of limited duration to prevent heat development. Alternatively, the duration may be longer, or may even be continuous, provided the intensity of the beam or the amount of absorbed energy is limited to keep heat development within limits. The shear wave signal 90 will propagate through the material of sample 26, and any structures 80 or density variations encountered will cause a fraction 92 of the input signal 90 to be scattered back to surface 25. The return signal 92 is picked up using the probe 28. The probe tip 30 in contact with surface 25 will receive the induced acoustic vibrations of return signal 92, and proper analysis of output signal 39 allows to isolate the signal components corresponding to the return signal 92. Any sub-surface structures 80 may be visualized by analysis of return signal 92 received via the vibration response of the cantilever 29 and the probe tip 30. This is measured through photo diode 38 and may thus be derived from output signal 39 by analyzing the output signal. This output signal 39 is provided to the analysis system 43. In the analysis system 43, a hardware or software module 73 isolates the scattered fraction 92 from the output signal 39 to provide an image of the subsurface structures 80.

Figure 4:
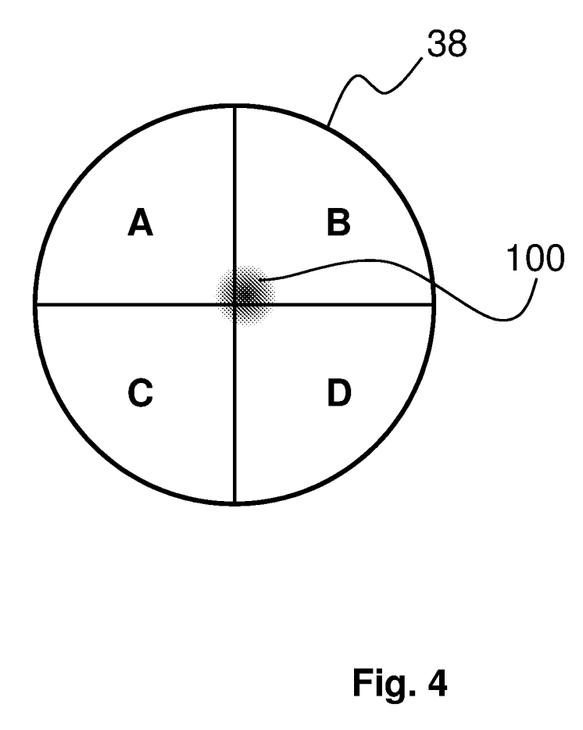
FIG. 4 illustrates a four quadrant photo sensor for use with the present invention.

The system 20 is configured for enabling determination of the torsional signal components, relating to the torsion of the cantilever. To this end, the photo diode 38, as explained, may be a four quadrant photo diode. As can be seen in FIG. 4, the photo diode 38 consists of four quadrants designated A, B, C and D. Since the degree of torsion of the cantilever supporting the probe is a relative measure of surface friction caused by the lateral force exerted on the scanning probe, the laser spot intensity for quadrants (A+C)−(B+D) may be regarded as the frictional signal between the probe and the sample surface. The analysis is performed in analysis system 43.

Figure 3:
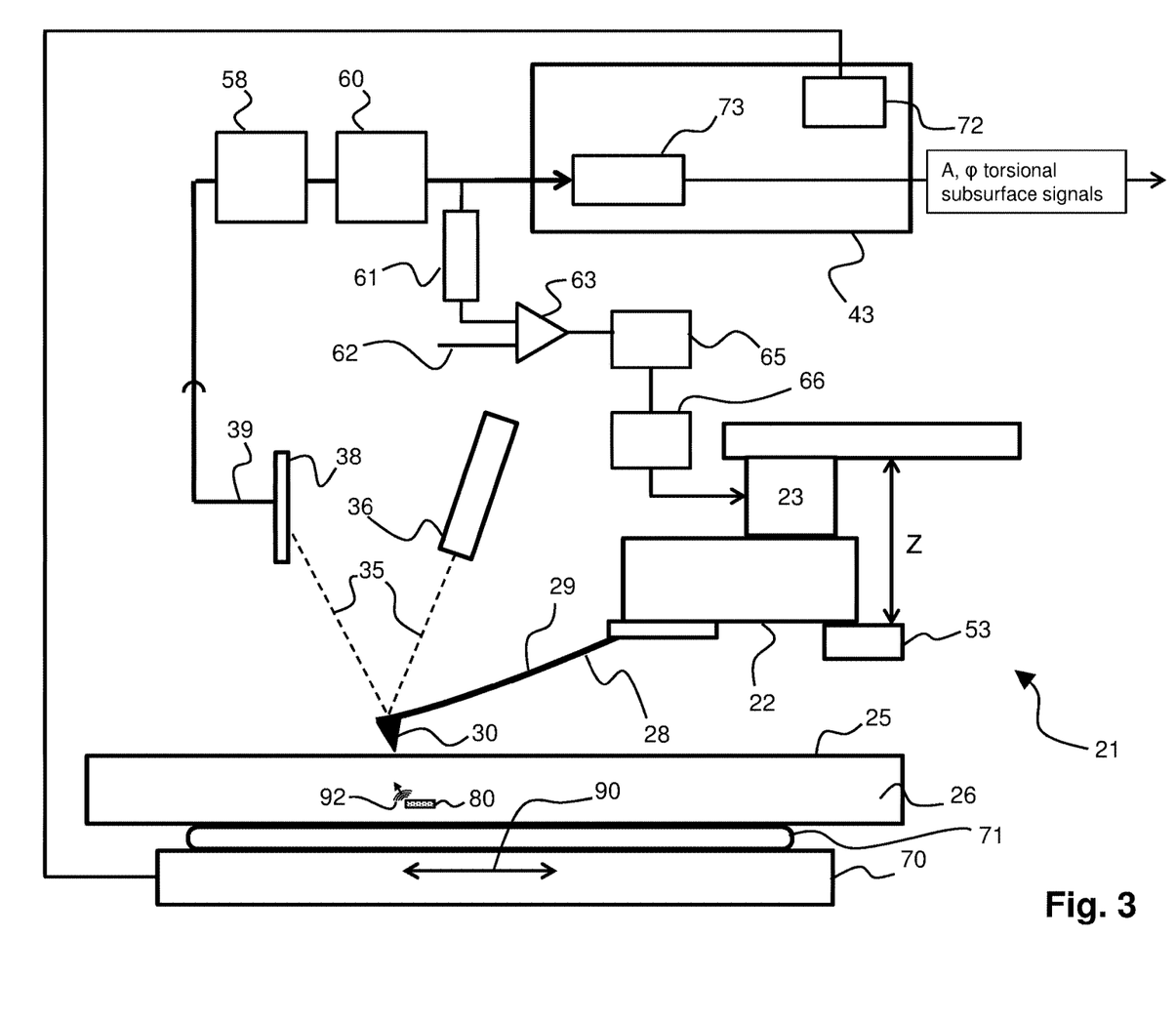
FIG. 3 illustrates a system in accordance with the present invention.

In addition to mapping sub-surface structures, the system 20 may further be arranged for performing regular atomic force microscopy such as to map on-surface structures on the surface 25. In FIGS. 2 and 3, to this end, the output signal 39 after pre-amplification in pre-amplifier 58 and after pre-analysis in analyzer 60, is provided both to the lock-in amplifier analysis system 43 and to a low pass filter 61. The low pass filter removes the high frequency components relating to the sub-surface measurements from the output signal and provides the signal to a comparator 63. The comparator compares the output signal with the set-point that is received at input 62 (e.g. from a controller system), and yields a differential signal that is provided to the feedback controller 65. The feedback controller provides a control signal for driving the piezo-electric actuators 23 for adjusting the z-level of the probe 28, i.e. the distance in height of the probe 28 above the surface 25. The corrections, which may be obtained from the feedback controller 65 by analyzing the control signal, may be more accurately determined with z-level sensor 53. The determined z-level corrections are mapped to provide a surface topography map of the surface 25.

FIG. 3 illustrates an alternative system 21 in accordance with a further embodiment of the invention. Many of the parts and elements of system 21 are similar or even may be identical to those of system 20, or provide a same or similar function. Where these elements only provide a same or similar function, these elements could be different from the corresponding elements described above in relation to FIG. 1. For the comprehensibility of the drawings, such elements may have been designated with same or similar reference numerals. At least in those cases where elements have different numbers, such elements may provide a different function in the system.

System 21, instead of (or in addition to) the pulsed laser 75, includes a transducer 70 mounted underneath the sample 26. The transducer 70 is a piezo type shear wave transducer, which enables the system 21 to apply the shear wave signal. In system 21, the transducer 70 may for example apply a shear wave signal at a frequency within a frequency range of 1 to 200 megahertz (MHz) or even up to few gigahertz.

Application of the shear wave signal 90, in accordance with the present invention, may be applied in various manners. System 20 relies on application via photo-thermal stimulation as achieved above using the pulse laser beam 76 and absorption layer 85. In particular, absorption layer 85 may consist of multiple thickness regions such as to provide signals of slightly different frequencies that enable heterodyne analysis of the difference frequency. The difference frequency may be within a range detectable through the probe 28.

The shear wave input signal may alternatively, as in system 21, be applied to the sample using a suitable piezo type transducer. The transducer 70 may be mounted to the back of the sample 26. For example, a transducer may be arranged on a sample carrier, and coupled to the sample using a transmissive medium which is transmissive with respect to the acoustic vibrations. A suitable medium may for example be provided by a grease or paste. Such a transducer 70 enables to apply ultrasonic shear waves of much lower frequencies (e.g. 10 kHz to 5 GHz (gigahertz)).

The present invention has been described in terms of some specific embodiments thereof. The embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible which should be considered within the scope of the appended claims. Also kinematic inversions are considered inherently disclosed and to be within the scope of the invention. Moreover, any of the components and elements of the various embodiments disclosed may be combined or may be incorporated in other embodiments where considered necessary, desired or preferred, without departing from the scope of the invention as defined in the claims.

In the claims, any reference signs shall not be construed as limiting the claim. The term 'comprising' and 'including' when used in this description or the appended claims should not be construed in an exclusive or exhaustive sense but rather in an inclusive sense. Thus the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

The invention claimed is:

1. A method of determining an overlay or alignment error between a first device layer and a second device layer of a multilayer semiconductor device on a substrate using an atomic force microscopy system, wherein the atomic force microscopy system comprises a scan head including a probe, and the probe comprises a cantilever and a probe tip arranged on the cantilever, wherein the method comprises:
    moving the probe tip and the multilayer semiconductor device relative to each other in one or more directions parallel to a surface of the multilayer semiconductor device for performing a scanning of the surface with the probe tip, wherein the probe tip is intermittently or continuously in contact with the surface during said scanning;
    applying, during said scanning and using a signal application actuator, an acoustic input signal to the substrate;
    monitoring a motion of the probe tip relative to the scan head with a probe tip position detector during said scanning for obtaining an output signal; and
    analyzing the output signal for generating a mapping of a one or more subsurface structures below the surface of the multilayer semiconductor device, the one or more subsurface structures being located in at least one of the first device layer or the second device layer, and determining the overlay or alignment error between the first device layer and the second device layer based on the mapping;
    wherein the signal application actuator includes a shear wave actuator,
    wherein the applying an acoustic input signal comprises applying an acoustic input signal to the substrate using at least the shear wave actuator to provide a shear acoustic wave in the substrate,
    wherein the output signal at least includes a sensor signal component indicative of a torsional deflection of the probe tip, and
    wherein the method includes obtaining said sensor signal component indicative of the torsional deflection of the probe tip.

2. The method according to claim 1, wherein the acoustic input signal comprises an input signal component having a frequency within a range of 20% from at least one mode of torsional resonance of the cantilever.

3. The method according to claim 1, wherein the acoustic input signal comprises an input signal component having a frequency within a range of 100 kilohertz to 50 megahertz.

4. The method according to claim 1, wherein the signal application actuator, in addition to the shear wave actuator, comprises a further actuator cooperating with the cantilever or the probe tip, and
    wherein the method comprises applying a flexural vibration signal to the cantilever or the probe tip using the further actuator.

5. The method according to claim 4, wherein the flexural vibration signal comprises at least one flexural signal component having a frequency in a range between 10 kilohertz to 2200 megahertz.

6. The method according to claim 1, wherein the acoustic input signal comprises multiple input signal components at various frequencies, the multiple input signal components including:
   a first input signal component at a first frequency, and
   a second input signal component at a second frequency,
   wherein the first frequency and the second frequency are within one of the group consisting of:
   a range of 20% from a mode of torsional resonance of the cantilever; and
   a range of 20% from a mode of flexural resonance of the cantilever.

7. The method according to claim 6, wherein the analyzing the output signal decouples each of the multiple output signal components pertaining to different signal components of said multiple signal components or said sensor signal component indicative of a torsional deflection.

8. The method according to claim 1, wherein the acoustic input signal applied to the substrate for providing the shear acoustic wave in the substrate comprises an input signal component having a frequency within a range of 50 megahertz to 500 gigahertz.

9. The method according to claim 8, wherein the acoustic input signal comprises a third input signal component at a third frequency and a fourth input signal component at a fourth frequency,
   wherein the third input signal component and the fourth input signal component together provide a mixed acoustic signal,
   wherein the mixed acoustic signal comprises a fifth signal component having a frequency equal to a difference between the third frequency and the fourth frequency,
   wherein at least one of:
   the frequency of the fifth signal component is below 1 gigahertz; and/or
   the frequency of the fifth signal component is within a range of 20% from a mode of flexural or torsional resonance of the cantilever.

10. The method according to claim 1, wherein the acoustic input signal comprises an input signal component having a frequency within a range of 100 kilohertz to 10 megahertz.

11. An atomic force microscopy system for determining an overlay or alignment error between a first device layer and a second device layer of a multilayer semiconductor device on a substrate, wherein the system comprises:
    a substrate carrier for supporting the substrate;
    a scan head including a probe, and wherein the probe comprises a cantilever and a probe tip arranged on the cantilever;
    an actuator configured to move the substrate carrier or the scan head, such as to move the probe tip and the multilayer semiconductor device relative to each other in one or more directions parallel to a surface of the multilayer semiconductor device for performing a scanning of the surface with the probe tip, wherein the probe tip is intermittently or continuously in contact with the surface during said scanning;
    a signal application actuator for applying, during said scanning, an acoustic input signal to the substrate;
    a probe tip position detector for monitoring a motion of the probe tip relative to the scan head during said scanning for obtaining an output signal; and
    a signal analyzer configured for:
      analyzing the output signal for generating a mapping of a one or more subsurface structures located in at least one of the first device layer or the second device layer, and
      determining the overlay or alignment error between the first device layer and the second device layer based on the mapping;
    wherein the signal application actuator includes a shear wave actuator for applying a shear acoustic wave in the substrate; and
    wherein the signal analyzer is configured for obtaining from the output signal a signal component indicative of a torsional deflection of the probe tip.

12. The system according to claim 11, wherein the signal application actuator is configured for providing the acoustic input signal including an input signal component having a frequency within a range of 100 kilohertz to 50 megahertz.

13. The system according to claim 11, wherein the signal application actuator further comprises a further actuator cooperating with the cantilever or the probe tip, and
    wherein the further actuator is configured for applying a flexural vibration signal to the cantilever or the probe tip.

14. The system according to claim 11, wherein the analyzer is configured for analyzing the output signal such as to decouple output signal components pertaining to different signal components included in the output signal, wherein each of the different signal components is associated with a different frequency or frequency range.

15. The system according to claim 11, wherein the shear wave actuator is configured for providing the shear acoustic wave of the acoustic input signal including an input signal component having a frequency within a range of 50 megahertz to 500 gigahertz, and
    wherein the shear wave actuator is configured for applying the shear acoustic wave of the acoustic input signal comprising a third input signal component at a third frequency and a fourth input signal component at a fourth frequency,
    wherein the third input signal component and the fourth input signal component together provide a mixed acoustic signal comprising a fifth signal component having a frequency equal to a difference between the third frequency and the fourth frequency, and
    wherein the frequency of the fifth signal component is below 1 gigahertz.

16. The system according to claim 15, wherein for applying the acoustic input signal by a photo-thermal acoustic stimulation, the shear wave actuator includes a pulsed laser for providing a pulse of optical radiation having a time-varying intensity,
    wherein the pulsed laser is configured for impinging the pulse of optical radiation on a layer of absorbing material located on a side face of the substrate,
    wherein the side face is transverse to the surface of the substrate,
    wherein the absorbing material is configured for absorbing optical energy of the optical radiation, and
    wherein for applying the shear acoustic wave including the third and fourth frequency, the layer of absorbing material includes at least one of the group consisting of:
    a first portion having a first thickness which is inversely proportional to the third frequency,
    a second portion having a second thickness which is inversely proportional to the fourth frequency; and a multiple absorption layer wherein each absorption layer has a thickness corresponding with at least one of the third or fourth frequency.

17. The system according to claim 11, wherein the signal application actuator is configured for providing the acoustic input signal including an input signal component having a frequency within a range of 100 kilohertz to 10 megahertz.

18. The system according to claim 11, wherein the signal application actuator is configured for providing the acoustic input signal including an input signal component having a frequency within a range of 50 megahertz to 500 gigahertz.

* * * * *